United States Patent
Yu

(10) Patent No.: US 9,070,612 B2
(45) Date of Patent: Jun. 30, 2015

(54) METHOD FOR FABRICATING OPTICAL MICRO STRUCTURE AND APPLICATIONS THEREOF

(71) Applicant: UNITED MICROELECTRONICS CORPORATION, Hsinchu (TW)

(72) Inventor: Cheng-Hung Yu, Taoyuan County (TW)

(73) Assignee: UNITED MICROELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 14/089,716

(22) Filed: Nov. 25, 2013

(65) Prior Publication Data
US 2014/0080245 A1    Mar. 20, 2014

Related U.S. Application Data

(62) Division of application No. 13/175,989, filed on Jul. 5, 2011, now abandoned.

(51) Int. Cl.
*H01L 21/00* (2006.01)
*H01L 27/146* (2006.01)

(52) U.S. Cl.
CPC .......... *H01L 27/14685* (2013.01); *Y10T 29/49* (2015.01); *H01L 27/14618* (2013.01); *H01L 27/14625* (2013.01); *H01L 27/14627* (2013.01)

(58) Field of Classification Search
None
See application file for complete search history.

(56) References Cited

U.S. PATENT DOCUMENTS

| | | | |
|---|---|---|---|
| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |
| 5,466,926 A | 11/1995 | Sasano |
| 5,587,696 A | 12/1996 | Su |
| 5,625,210 A | 4/1997 | Lee |
| 5,650,864 A | 7/1997 | Tseng |
| 5,830,624 A | 11/1998 | Bae et al. |
| 5,880,495 A | 3/1999 | Chen |
| 5,977,535 A | 11/1999 | Rostoker |
| 6,006,764 A | 12/1999 | Chu et al. |
| 6,071,826 A | 6/2000 | Cho |
| 6,081,018 A | 6/2000 | Nakashiba |
| 6,087,211 A | 7/2000 | Kalnitsky et al. |
| 6,124,200 A | 9/2000 | Wang |
| 6,294,313 B1 | 9/2001 | Kobayashi et al. |
| 6,297,160 B1 | 10/2001 | Chien |
| 6,338,976 B1 | 1/2002 | Huang |

(Continued)

*Primary Examiner* — Charles Garber
*Assistant Examiner* — Brigitte Paterson
(74) *Attorney, Agent, or Firm* — Ding Yu Tan

(57) ABSTRACT

A method for fabricating an image sensor, wherein the method comprises steps as follows: Firstly, a transparent substrate is formed on a working substrate. Pluralities of micro lens are formed in the transparent substrate, wherein the lenses have a refraction ratio differing from that of the transparent substrate. Subsequently, a color filter is formed on the lenses. Afterward, the color filter is engaged with an image sensing device by flipping around the working substrate.

6 Claims, 9 Drawing Sheets

(56) References Cited

U.S. PATENT DOCUMENTS

| | | |
|---|---|---|
| 6,352,876 B1 | 3/2002 | Bordogna |
| 6,376,797 B1 | 4/2002 | Piwczyk |
| 6,407,415 B2 | 6/2002 | Lee |
| 6,433,844 B2 | 8/2002 | Li |
| 6,482,669 B1 | 11/2002 | Fan |
| 6,514,810 B1 | 2/2003 | Kim |
| 6,566,151 B2 | 5/2003 | Yeh |
| 6,617,189 B1 | 9/2003 | Chen et al. |
| 6,632,700 B1 | 10/2003 | Fan |
| 6,641,464 B1 | 11/2003 | Steere, III |
| 6,664,191 B1 | 12/2003 | Kim |
| 6,730,555 B2 | 5/2004 | Kim |
| 6,794,215 B2 | 9/2004 | Park |
| 6,821,809 B2 | 11/2004 | Abe |
| 6,841,848 B2 | 1/2005 | MacNamara |
| 6,846,722 B2 | 1/2005 | Lee |
| 6,849,533 B2 | 2/2005 | Chang |
| 6,872,584 B2 | 3/2005 | Nakashiba |
| 6,921,934 B2 | 7/2005 | Patrick |
| 6,953,608 B2 | 10/2005 | Leu |
| 6,960,512 B2 | 11/2005 | Cheng et al. |
| 7,078,779 B2 | 7/2006 | Wang |
| 7,115,924 B1 | 10/2006 | LaMaster |
| 7,129,172 B2 | 10/2006 | Morrow |
| 7,180,044 B2 | 2/2007 | Yu |
| 7,199,439 B2 | 4/2007 | Farnworth |
| 7,229,745 B2 | 6/2007 | Lamarre |
| 7,315,359 B2 | 1/2008 | Hong |
| 7,328,915 B2 | 2/2008 | Smith |
| 7,498,190 B2 | 3/2009 | Kao |
| 7,648,851 B2 | 1/2010 | Fu |
| 7,655,495 B2 | 2/2010 | Adkisson |
| 2001/0023086 A1 | 9/2001 | Park et al. |
| 2004/0122328 A1 | 6/2004 | Wang |
| 2005/0103983 A1 | 5/2005 | Yamaguchi |
| 2005/0121599 A1 | 6/2005 | Mouli |
| 2005/0186739 A1 | 8/2005 | Wang |
| 2005/0247963 A1 | 11/2005 | Chen |
| 2005/0274988 A1 | 12/2005 | Hong |
| 2005/0274996 A1 | 12/2005 | Iwawaki |
| 2006/0054946 A1 | 3/2006 | Baek et al. |
| 2006/0114374 A1* | 6/2006 | Segawa et al. .................. 349/95 |
| 2006/0124833 A1 | 6/2006 | Toda |
| 2006/0146230 A1 | 7/2006 | Joon |
| 2006/0146412 A1 | 7/2006 | Kim |
| 2006/0172451 A1 | 8/2006 | Park |
| 2006/0183265 A1 | 8/2006 | Oh |
| 2006/0231898 A1 | 10/2006 | Jeong |
| 2007/0010042 A1 | 1/2007 | Li |
| 2007/0012970 A1 | 1/2007 | Mouli |
| 2007/0023851 A1 | 2/2007 | Hartzell |
| 2007/0031988 A1 | 2/2007 | Agranov |
| 2007/0052050 A1 | 3/2007 | Dierickx |
| 2007/0072326 A1 | 3/2007 | Zheng |
| 2007/0117253 A1 | 5/2007 | Hsu |
| 2007/0158772 A1 | 7/2007 | Boettiger |
| 2007/0166649 A1 | 7/2007 | Yu |
| 2007/0202696 A1 | 8/2007 | Inuiya |
| 2008/0036020 A1 | 2/2008 | Ko |
| 2008/0055733 A1 | 3/2008 | Lim |
| 2008/0116537 A1* | 5/2008 | Adkisson et al. ............. 257/448 |
| 2008/0121805 A1 | 5/2008 | Tweet |
| 2008/0121951 A1 | 5/2008 | Kao |
| 2008/0169546 A1 | 7/2008 | Kwon |
| 2008/0265348 A1 | 10/2008 | Maas |
| 2009/0065684 A1 | 3/2009 | Kim |
| 2009/0066954 A1 | 3/2009 | Opsal |
| 2009/0121264 A1 | 5/2009 | Kao |
| 2009/0124037 A1 | 5/2009 | Yu |
| 2009/0127643 A1 | 5/2009 | Lu |
| 2009/0134484 A1 | 5/2009 | Lin |
| 2009/0168181 A1 | 7/2009 | Su |
| 2009/0170233 A1 | 7/2009 | Yun |
| 2009/0200585 A1 | 8/2009 | Nozaki |
| 2009/0212335 A1 | 8/2009 | Kao |
| 2009/0256258 A1 | 10/2009 | Kreupl |
| 2009/0294888 A1 | 12/2009 | Tsai |
| 2009/0321862 A1 | 12/2009 | Yu |
| 2010/0003623 A1 | 1/2010 | Liu |
| 2010/0025791 A1* | 2/2010 | Ogawa et al. .................. 257/432 |
| 2010/0038688 A1 | 2/2010 | Wu |
| 2010/0044813 A1 | 2/2010 | Wu |
| 2010/0096359 A1 | 4/2010 | Shiu |
| 2010/0144156 A1 | 6/2010 | Shih |
| 2010/0159632 A1 | 6/2010 | Rhodes |
| 2010/0264551 A1* | 10/2010 | Farooq et al. .................. 257/777 |
| 2012/0012960 A1* | 1/2012 | Yang et al. .................... 257/432 |
| 2012/0091549 A1 | 4/2012 | Chou |

* cited by examiner

METHOD FOR FABRICATING OPTICAL MICRO STRUCTURE AND APPLICATIONS THEREOF

CROSS-REFERENCE TO RELATED APPLICATION

This application is a divisional application of U.S. application Ser. No. 13/175,989, filed on Jul. 5, 2011, and now pending. The entirety of the above-mentioned patent application is hereby incorporated by reference herein and made a part of this specification.

FIELD OF THE INVENTION

The present invention relates to a fabricating method of an optical microstructure and the applications thereof, and more particularly to a method for fabricating an optical microstructure applying for manufacturing an image sensor and the applications thereof.

BACKGROUND OF THE INVENTION

By virtue of the technical improvement and increased requirement of consumer electrics with image processing functions, such as digital cameras, scanners or smart phones, the demand for image sensors is continually growing.

Generally, image sensors can be divided into two types, front-side illuminated image sensors and backside illuminated image sensors.

Since the sensor array of a front-side illuminated image sensor is disposed on the front side of a semiconductor substrate, over which a plurality of inter-metal layers are formed, the incident light entering the image sensor must pass through gaps in the inner-metal layers, and the light is obstructed by the inner-metal layers and cannot be delivered efficiently to the sensor array, thus the quanta efficiency of the front-side illuminated image sensor can be inversed effected.

In comparison to a front-side illuminated image sensor, the incident light of a backside illuminated image sensor is arranged to entering the image sensor through the backside of the substrate rather than passing through the inner-metal layers, such that most of the incident light can be delivered to the sensor array without any obstruction. Thus the quanta efficiency of the backside illuminated image sensor is significantly better than that of the front-side illuminated image sensor.

However, fabricating a backside illuminated image sensor requires additional procedures in contrast to fabricating a front-side illuminated image sensor. For example, fabricating a backside illuminated image sensor requires a substrate thinning procedure after a handle wafer is bound on the front side of the inner-metal layers. Besides, the existence of the handle wafer may obstruct the subsequent packaging process from making the wiring bond pad of the inner-metal layer, thus some additional through silicon vias (TSV) may be needed. Accordingly, fabricating a backside illuminated image sensor is more complicated and costly than fabricating a front-side illuminated image sensor.

Currently, an improved technology has been adopted by those skilled in the art, wherein an essential color filter associated with lens is embedded in a front-side illuminated image sensor by the conventional lithography process in order to reduce the optical path and improve the quanta efficiency of the front-side illuminated image sensor, thus the front-side illuminated image sensor can provide an optical performance substantially similar to that of a backside illuminated image sensor.

However, since the rough and unevenness surface of the embedded color filter may adversely affect the subsequent process and yield, thus the embedding depth of the color filter may be limited. These problems may get worse, as the current front-side illuminated image sensor is required to provide more and more resolution and small pixel size.

Therefore, it is necessary to provide an improved optical microstructure with a stand-alone color filter associated with micro lens to manufacture an image sensor with higher quanta efficiency and lower manufacturing cost, and to improve the long existing cross-talk problems.

SUMMARY OF THE INVENTION

According to one aspect of the present invention is to fabricate an image sensor comprises a plurality of color filtering elements, a plurality of lenses and an image sensing device, wherein the lenses are correspondingly formed over the color filtering elements, and the image sensing device having a sensing area engaged with the color filtering elements.

In some embodiments of the present invention, the color filtering elements are buried in a dielectric layer of the sensing area and with a depth extending beyond a bottom metal which is disposed in the dielectric layer and adjacent to the sensing area. In some other embodiments, the color filtering elements are contiguously disposed on a backside of the image sensing device. In some embodiments of the present invention, the image sensor further comprises a planarization layer disposed between the lenses and the color filtering elements.

In some embodiments of the present invention, the image sensor has a wafer-scale structure which can be cut into a plurality of image sensing chips.

In some embodiments of the present invention, the image sensor further comprises a working substrate and a transparent substrate disposed on the working substrate, wherein the transparent substrate has a plurality of recesses allowing the lenses correspondingly embedded therein.

In some embodiments of the present invention, the image sensor further comprises a passive layer disposed on the transparent substrate opposite to the lenses.

According to another aspect of the present invention is to provide a method for fabricating an image sensor, wherein the method comprises steps as follows: Firstly, a transparent substrate is formed on a working substrate. Pluralities of micro lens are formed in the transparent substrate, wherein the lenses have a refraction ratio differing from that of the transparent substrate. Subsequently, a color filter is formed on the lenses. Afterward, the color filter is engaged with an image sensing device by flipping the working substrate.

In some embodiments of the present invention, the engagement of the color filter and the image sensing device comprises steps of forming a concave portion in the sensing area and then contiguously disposing the color filter to a bottom of the concave portion. In some other embodiments, the engagement of the color filter and the image sensing device comprises steps of disposing the color filter contiguously to a backside of the image sensing device.

In some embodiments of the present invention, the formation of the color filter comprises steps of forming a plurality of color filtering elements over and corresponding to the lenses. In some other embodiments of the present invention, the formation of the color filter comprises steps of forming a planarization layer overlying the lenses, and forming a plurality of color filtering elements overlying the planarization layer.

In some embodiments of the present invention, after the color filter is engaged with the image sensing device, the working substrate is planarized, whereby the remaining working substrate can serve as a passive layer to protect the color filter.

In some embodiments of the present invention, after the color filter is engaged with the image sensing device, the working substrate is removed and a passive layer is formed on the transparent substrate opposite to the lenses.

According to a third aspect of the present invention, a method for fabricating an image sensor comprises steps as follows: A color filter wafer having a plurality of color filters and an image sensor wafer having a plurality of image sensing devices are firstly provided, wherein each of the image sensing device has a sensing area corresponding to one of the color filters. Subsequently, the color filter wafer is engaged with the image sensor wafer to make each of the color filter buried in a dielectric layer of the sensing area with a depth extending beyond a bottom metal disposed in the dielectric layer and adjacent to the sensing area.

In some embodiments of the present invention, after the color filter wafer and the image sensor wafer are engaged, a wafer sawing process is carried out to cut the engaged color filter wafer and the image sensor wafer into a plurality of image sensing chips and each image sensing chip at least comprises one of the micro lens, one of the image sensing devices and one of the color filters.

According to aforementioned embodiments of the present invention, a fabricating method of an improved image sensor thereof is provided. Instead of directly forming the essential color filter layer on an image sensing element to form an image sensor by a series of complicated fabrication processes, as the prior art does; the color filter is formed on an independent transparent substrate and subsequently engaged to an image sensing element to form an image sensor. Therefore, the present fabricating method is capable of being applied for fabricating either a BSI image sensor or a FSI image sensor with the advantages of simplifying the packaging process.

When the independent optical microstructure is applied, especially, for fabricating a FSI image sensor, the color filter can be pre-planarized to solve the problems and the adverse effects resulted from the roughness and unevenness surface, thus the color filter can be embedded into the FSI image sensing element more deeply, and the optical path of the FSI image sensor can be significantly decreased, whereby the quanta efficiency of the FSI image sensor can be significant enhanced, and the long existing cross-talk problems can also be improved. Since, the fabricating cost of a FSI image sensor is significantly less than that of a typical BSI image sensor, thus the embodiments of the present invention can provide an image sensor with a performance substantially similar to that provided by a typical BSI image sensor but with a fabricating cost significantly lower than that of the BSI image sensor.

In order to make the aforementioned and other objects, features and advantages of the present invention comprehensible, preferred embodiment accompanied with figures are described in detail below.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
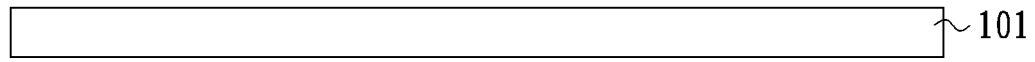
FIGS. 1A to 1E illustrate cross-sectional views of the processing structures for fabricating an optical microstructure in accordance with one embodiment of the present invention.

Detail descriptions of several embodiments eligible to exemplify the features of making and using the present invention are disclosed as follows. It must be appreciated that the following embodiments are just example, but not used to limit the scope of the present invention. Wherever possible, the same reference numbers are used in the drawings and the description to refer to the same or like parts.

One of the objects of the present invention is to fabricate an improved image sensor having an optical microstructure 100. FIGS. 1A to 1E illustrate cross-sectional views of the processing structures for fabricating an optical microstructure 100 in accordance with one embodiment of the present invention.

The method for fabricating the optical microstructure 100 comprises steps as follows: A working substrate 101 (shown in FIG. 1A) is provided. In some embodiments of the present invention, the working substrate 101 is a glass substrate, a silicon substrate or a silicon wafer.

Figure 1B:
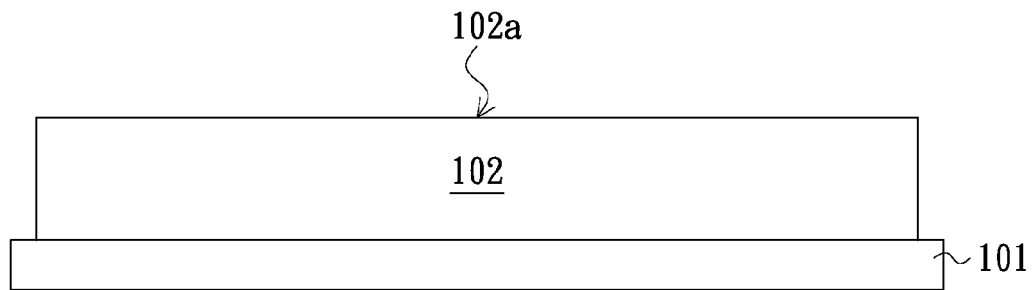

A transparent substrate 102 contiguous to the working substrate 101 is then provided (shown in FIG. 1B). In some embodiments of the present invention, the transparent substrate 102 can be a preformed transparent board directly attached onto the working substrate 101. In some embodiments of the present invention, the transparent substrate 102 can be otherwise a transparent layer structure formed on the working substrate 101 by a deposition process, an electroplating process, printing process, spin coating or the like.

The material of the transparent substrate 102 can be similar to or different from that of the working substrate 101. In some preferred embodiments, the material of the transparent substrate 102 has index refraction different from that of the material of the working substrate 101. The preferred material of the transparent substrate 102 may be silicon, resin, glass, propylene glycol methyl ether acetate (PGMEA), poly-glycidyl methyl acrylate (PGMA) or the arbitrary combinations thereof.

Figure 1C:
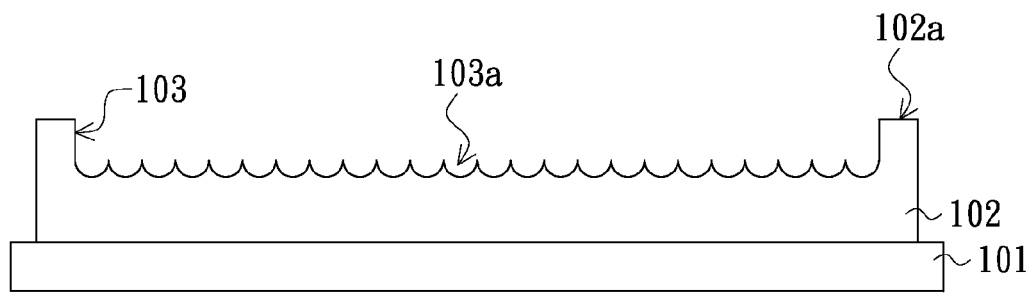

Next, at least one recess 103 is formed on a top surface 102a of the transparent substrate 102 (shown in FIG. 1C). In some embodiments of the present invention, the recess 103 is formed by an etching process. In the present embodiment, the etching process is conducted on the top surface 102a of the transparent substrate 102 to form a pattern comprising a plurality of recesses 103. In some embodiments of the present invention, each of the recesses 103 has a cross sectional shape such as an arc or other geometric patterns, and these recesses 103 may be connected with one another or departed from each other. In the present embodiment, each of these recesses 103 has a bottom surface 103a with a shape in a semicircle under cross-sectional view, and these recesses 103 are connected with one another to form an array pattern.

Figure 1D:
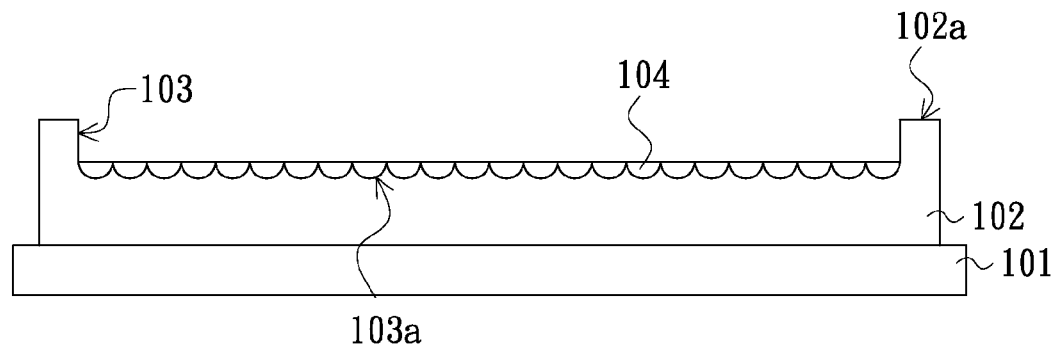

Subsequently, a plurality of lenses 104 are correspondingly formed in the recesses 103, as shown in FIG. 1D. The lenses 104 preferably consist of a transparent glass, plastic polymers (such as resin, PGMEA, PGMA or the arbitrary combinations thereof) or a semiconductor material (such as silicon).

In some embodiments of the present invention, the formation of the lenses 104 comprises steps of partially filling the recesses 103 with a transparent material to make the transparent material conformable to the bottom surface 103a of the corresponding recess 103, and then coagulating the transparent material. In the present embodiment, the lenses 104 formed in the corresponding recesses 103 are of a hemispherical transparent structure made of the coagulated transparent material.

In order to serve as a light condenser, the refraction index of the lens 104 should be different from that of the transparent substrate 102. The refraction index of the lenses 104 preferably is greater than that of the transparent substrate 102.

Figure 1E:
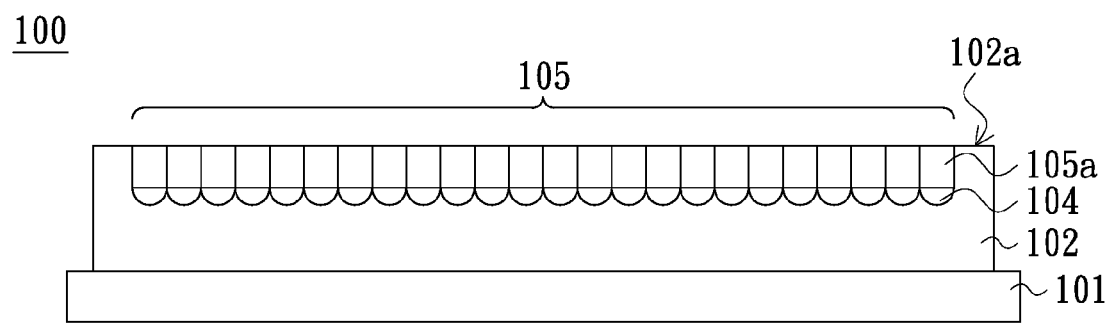

Afterward, a plurality of color filtering elements 105a are formed on the lenses 104 (shown in FIG. 1E). In some embodiments of the present invention, each of the color filtering elements 105a may be a color filtering element with an individual color including red, green, blue, cyan, magenta and yellow, whereby the combination of the color filtering elements 105a can constitute a color filter 105 with a single color. In some other embodiments of the present invention, the color filter 105 alternately includes a plurality of color filtering elements with various colors.

In some preferred embodiments of the present invention, the formation of the color filter 105 comprises several steps as follows: Pluralities of patterned resists (not shown) are sequentially blanketed over the lens 104 associate. A plurality of color filtering elements 105a with different colors are then formed on the lenses 104 over the corresponding lenses 104 by using the correspondingly patterned resist as a mask respectively.

In some preferred embodiments of the present invention, each of the color filtering elements 105a may partially fill the corresponding recess 103, and there remains a gap between the color filter 105 and the top surface 102a of the transparent substrate 102. In some other embodiments of the present invention, each of the color filtering elements 105a fills the corresponding recess 103, whereby the color filter 105 may extend over the top surface 102a of the transparent substrate 102.

In order to keep the morphology of the color filter 105 flat, a planarization process is conducted to make the color filter 105 conformable to the top surface 102a of the transparent substrate 102.

As shown in FIG. 1E, the optical microstructure 100 formed by the aforementioned method comprises a working substrate 101, a transparent substrate 102, a plurality of the lenses 104 and a color filter 105 constituted by a plurality of color filtering elements 105a. The transparent substrate 102 is contiguously disposed on the working substrate 101 and has a plurality of recesses 103 formed on the top surface 102a; each of the lenses is disposed in the corresponding recess 103; and the color filtering elements 105a are correspondingly disposed on the lenses 104 and fill the recesses 103, so as to make the color filter 105 conformable to the top surface 102a of the transparent substrate 102.

Figure 2:
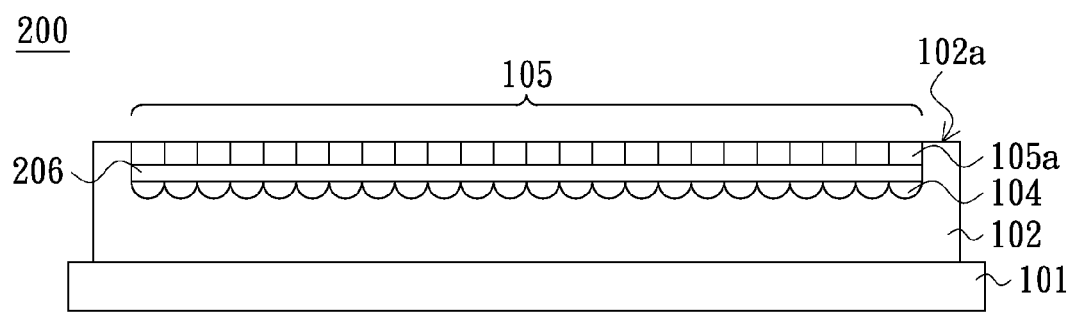
FIG. 2 illustrates a cross-sectional view of an optical microstructure in accordance with one embodiment of the present invention.

FIG. 2 illustrates a cross-sectional view of an optical microstructure 200 fabricated in accordance with another embodiment of the present invention. The physical structure of the optical microstructure 200 is similar to the optical microstructure 100 (as shown in FIG. 2, identical reference numbers are used to refer to the identical elements shown in FIG. 1E), the major difference between these two optical microstructures 100 and 200 is that the optical microstructure 200 further comprises a planarization layer 206 disposed between the lenses 104 and the color filter 105. In the present embodiment, the planarization layer 206 is formed prior the steps of forming the color filtering elements 105a on the lenses 104 to fill the recesses 103.

Figure 3:
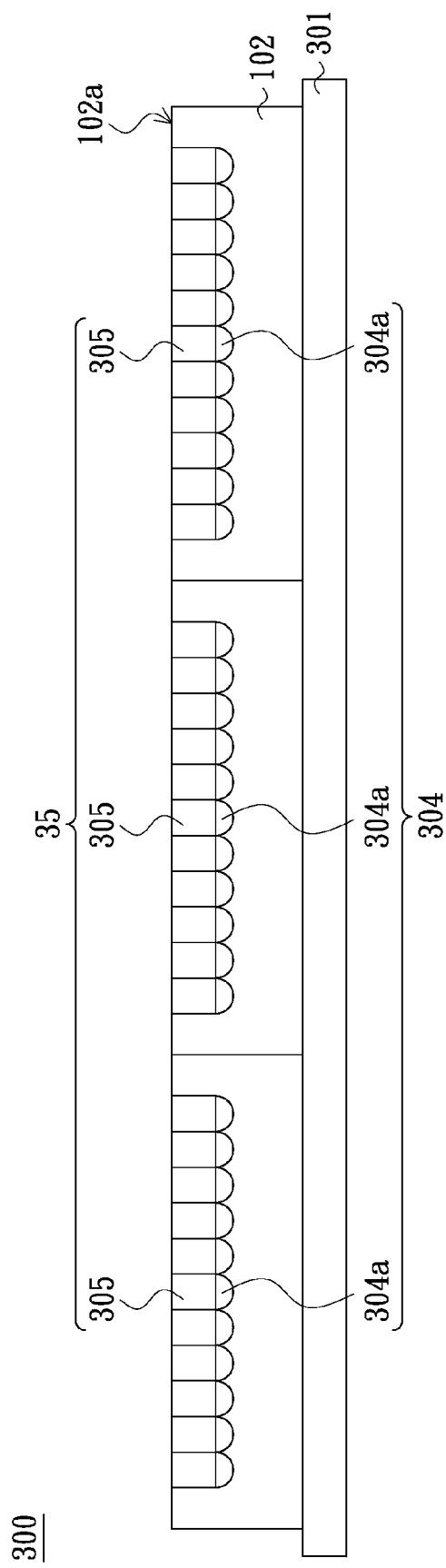
FIG. 3 illustrates a cross-sectional view of a wafer-scale optical microstructure, in accordance with one embodiment of the present invention.

FIG. 3 illustrates a cross-sectional view of a wafer-scale optical microstructure, fabricated in accordance with a third embodiment of the present invention. The physical structure of the optical microstructure 300 is similar to the optical microstructure 100; however the major difference between these two optical microstructures 100 and 300 is that the optical microstructure 300 (thereinafter is referred as color filter wafer 300) is a wafer-scaled structure having a color filter array 35 constituted by a plurality of separated lenses 304 and a plurality of separated color filters 305 formed on a working wafer 301. In some embodiments, the color filter wafer 300 may be cut to divide into a plurality of chips in accordance with the arrangement of the color filters 305, whereby each of the image sensing chips has a color filter 305 and can be used to engage with an image sensing element to form an image sensor. In some other embodiments, the color filter wafer 300 is otherwise engaged with an image sensor wafer (not shown) which comprises a plurality of image sensing devices formed on a semiconductor wafer. A wafer sawing process is then is carried out to cut the engaged color filter wafer 300 and the image sensor wafer into a plurality of image sensing chips (not shown) and each comprises at least one of the micro lenses, the image sensing device and the color filter. For the suppose of clearly describing the features of the present invention, the engagement of the color filter wafer 300 and the image sensor wafer will be illustrated by the following embodiments which merely comprise one color filter and one image sensing device.

Figure 4A:
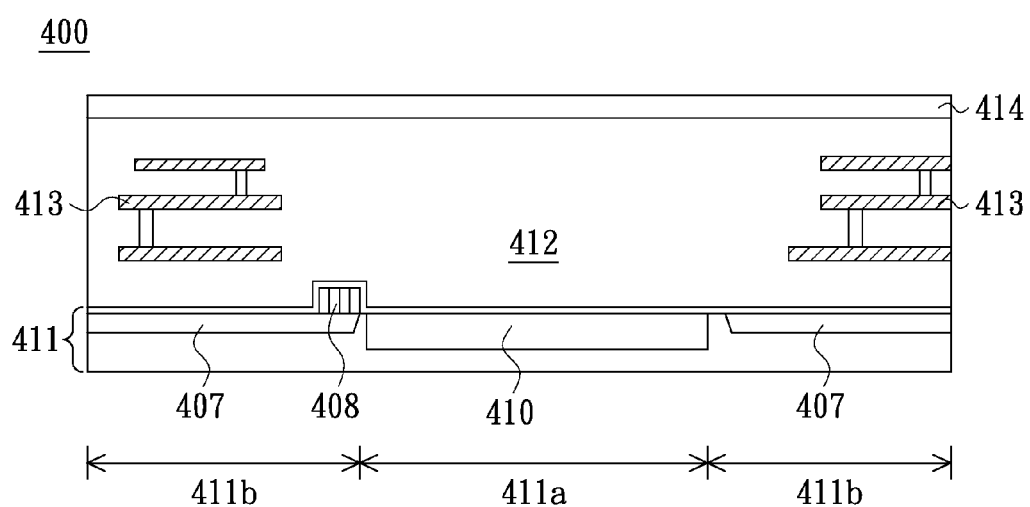
FIGS. 4A to 4D illustrate cross-sectional views of the processing structures for fabricating a front-side illuminated image sensor in accordance with one embodiment of the present invention.
Figure 4B:
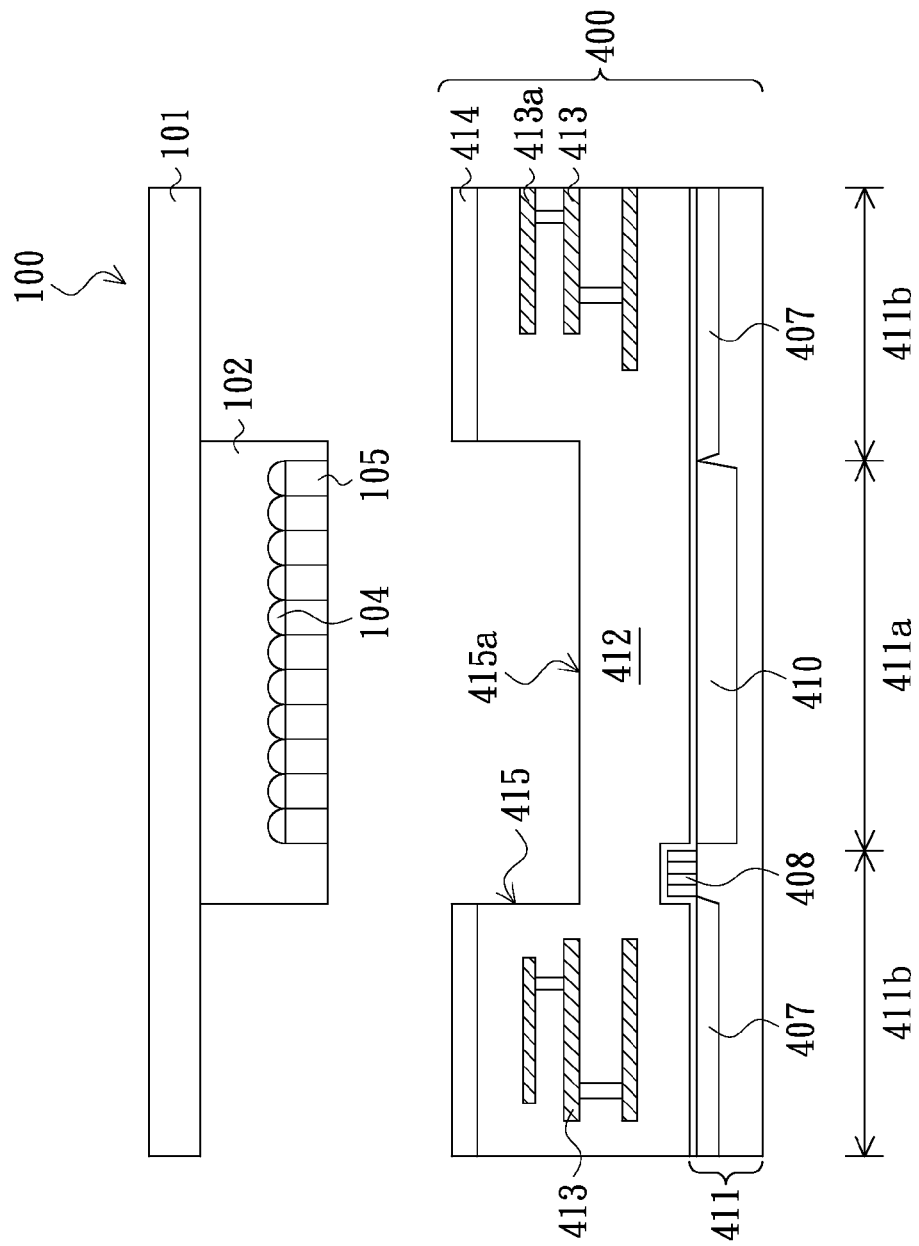
Figure 4C:
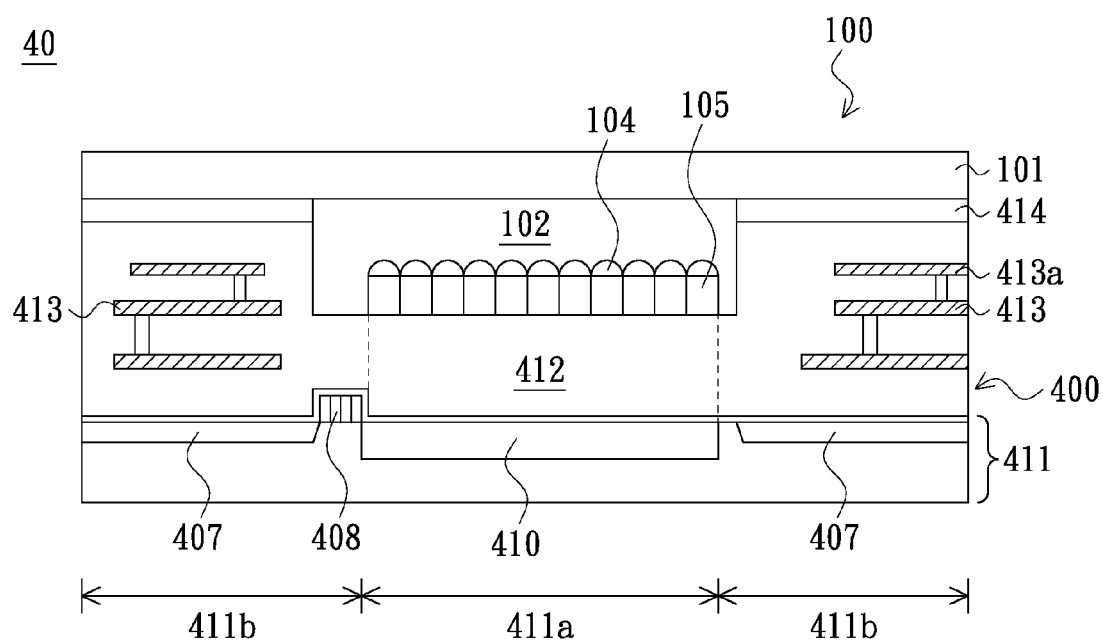

FIGS. 4A to 4C illustrate cross-sectional views of the processing structures for fabricating a FSI image sensor 40 in accordance with one embodiment of the present invention.

The method for fabricating the FSI image sensor 40 comprises steps as follows: Firstly, an optical microstructure, such as the optical microstructure 100 shown in FIG. 1E, and a FSI image sensing element 400 are provided.

As shown in FIG. 4A, the FSI image sensing element 400 comprises a sensing area 411a and a peripheral area 411b formed on a silicon substrate 411 by a front-end-of-line (FEOL) process. In some embodiments of the present invention, the sensing area 411a comprises at least one photodiode 410 and at least one transfer gate 408. An inner dielectric material layer 412, and a protection layer 414 are sequentially blanketed over the sensing area 411a and the peripheral area 411b, and at least one inner-metal layer 413 are buried in the inner dielectric material layer 412 involved in the peripheral area 411b.

In the present invention, the sensing area 411a comprising at least one photodiodes 410 are defined as the region isolated between two shallow trench isolations (STI) 407 formed in the silicon substrate 411, and the peripheral area 411b is defined as the region over the two STIs 407 on which a portion of the inner-metal layer 413 stacked.

Subsequently, the transparent substrate 102 of the optical microstructure 100 is engaged with the image sensing element 400 to make the color filter 105 contiguous to the sensing area 411a.

In some embodiments of the present invention, a concave portion 415 is formed by partially or completely removing the inner dielectric material layer 412 and the passive layer 414 involved in the sensing area 411a (as shown in FIG. 4B) prior the engagement of the optical microstructure 100 and the image sensing element 400.

The depth of the concave portion 415 may vary in accordance with the optical requirement of the image sensor 40. For example, the concave portion 415 preferably extends, through the protection layer 414 and downward into the inner dielectric material layer 412, at least beyond one of the stacked inner-metal layers, or even extends through the protection layer 414 and the inner dielectric material layer 412 so as to expose the silicon substrate 411 of the sensing area 411a.

In the present embodiment, the concave portion 415 is formed by an etching process to remove a portion of the protection layer 414 and a portion of the inner dielectric material layer 412, whereby the concave portion 415 extends through the protection layer 414 and downwards into the inner dielectric material layer 412 beyond a top metal layer 413a (which is also referred as the bottom metal layer). In other words, a bottom 415a of the concave portion 415 may extend beyond the top metal layer 413a of the stacked inner-metal layers 413 from the inner dielectric material layer 412.

After the formation of the concave portion 415, the optical microstructure 100 is flipped over or around, and the color filter 105 associated with the transparent substrate 102 is then embedded into the concave portion 415 of the image sensing element 400, whereby the color filter 105 is disposed contiguous to the bottom 415a of the concave portion 415, and the FSI image sensor 40 as shown in FIG. 4C is formed.

Figure 5:
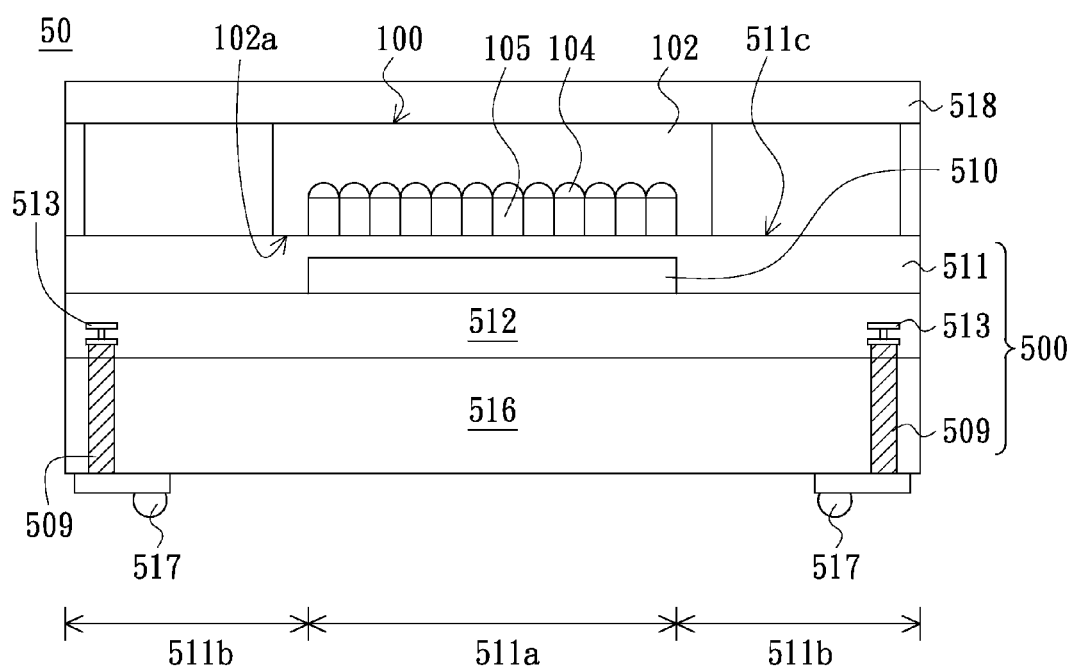
FIG. 5 illustrates a cross-sectional view of a backside illuminated image sensor in accordance with one embodiment of the present invention.

It should be noted that the optical microstructure 100 is not only applicable for fabricating a FSI image sensor but also for fabricating a BSI image sensor. FIG. 5 illustrates a cross-sectional view of a BSI image sensor 50 having the optical microstructure 100 in accordance with one embodiment of the present invention.

In the present embodiment, a BSI image sensing element 500 is engaged with the optical microstructure 100 to form the BSI image sensor 50. Similar to the FSI image sensing element 400, the BSI image sensing element 500 also comprises a silicon substrate 511 having at least one photodiode 510, a sensing area 511a, a peripheral area 511b and a plurality of inner-metal layer 513 buried in a dielectric material 512, wherein the sensing area 511a and the peripheral area 511b are formed on the silicon substrate 511 by a FEOL process, and the inner-metal layers 513 and the dielectric material 512 are formed on the sensing area 511a and the peripheral area 511b by a back-end-of-line (BEOL) process. The major difference between the FSI image sensing element 400 and the BSI image sensing element 500 is that the BSI image sensing element 500 further comprises a handle wafer 516 bonded on to the dielectric material 512 and the inner-metal layers 513, and the backside 511c of the silicon substrate 511 is subjected to a thinning process preceding the engagement of the optical microstructure 100 and the BSI image sensing element 500.

In the present embodiment, the engagement of the optical microstructure 100 and the BSI image sensing element 500 comprises steps as follows: The color filter 105 of the optical microstructure 100 is aligned with the sensing area 511a of the BSI image sensing element 500, and the color filter 105 is then attached on to the backside 511c of the silicon substrate 511 before the working substrate 101 is removed. After subsequent wiring and packaging processes, a plurality of through silicon vias (TSV) 509 and bond pads electrically connected to the inner-metal layers 513 are formed, and the BSI image sensor 50 is completed.

In addition, the working substrate 101 can be either removed or remained after the optical microstructure 100 is engaged with the FSI image sensing element 400 (or the BSI image sensing element 500). For example, in some embodiments, the working substrate 101 is thoroughly or partially removed and the remaining portion thereof may serve as a passive layer to protect the color filter 105 and the lenses 104. In some embodiments of the present invention, a releasing film (not shown) may be disposed between the working substrate 101 and the transparent substrate 102, whereby after the optical microstructure 100 is engaged with the FSI image sensing element 400 (or the BSI image sensing element 500), the working substrate 101 can be released from the transparent substrate 102 and reused again.

Figure 4D:
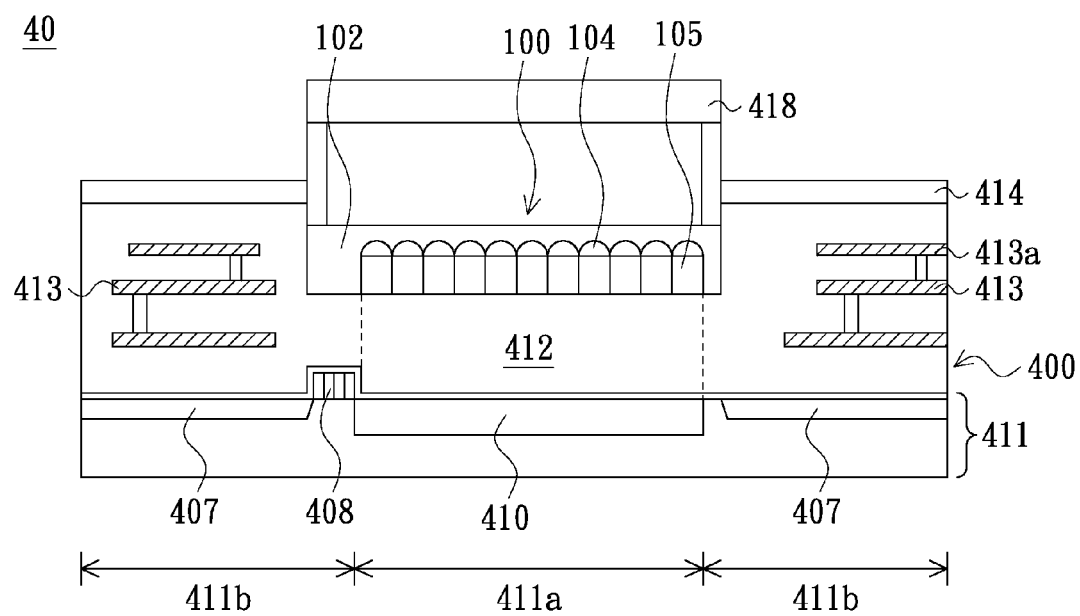

In some other embodiments of the present invention, a grinding process is conducted to remove the working substrate 101 or even a portion of the transparent substrate 102. Although the exposed transparent substrate 102 can serve as a passive layer to protect the color filter 105 and the lens 104, in some preferred embodiments, an additional planarization or package process may conducted on the transparent substrate 102 to form a planarization layer or a passive layer 418 (518), shown in FIG. 4D (FIG. 5), to serve as a protection layer or a passive layer of the color filter layer and the lenses 104. In the present embodiment, a passive layer 418 (518) made of silicon, glass or the like, is attached on the transparent substrate 102 by a package process.

According to aforementioned embodiments of the present invention, an improved image sensor and the fabricating method thereof are provided. Instead of directly forming the essential color filter layer on an image sensing element to form an image sensor by a series of complicated processes, as done by the prior art teachings; the color filter is formed on an independent transparent substrate and subsequently engaged to an image sensing element to form an image sensor. Therefore, the present method is capable of being applied for fabricating either a BSI image sensor or a FSI image sensor with the advantage of simplifying the packaging process.

When the independent optical microstructure is applied, especially, for fabricating a FSI image sensor, the color filter can be pre-planarized to solve the problems and the adverse effects resulted from the roughness and unevenness surface, thus the color filter can be embedded into the FSI image sensing element more deeper, and the optical path of the FSI image sensor can be significantly decreased, whereby the quanta efficiency of the FSI image sensor can be significant enhanced, and the long existing cross-talk problems can also be improved. Since, the fabricating cost of a FSI image sensor is significantly less than that of a typical BSI image sensor, thus the present invention can provide an image sensor with a performance substantially similar to that provided by a typical BSI image sensor but with a fabricating cost significantly lower than that of a BSI image sensor.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for fabricating an image sensor, comprising:
forming a transparent substrate on a working substrate;
forming a plurality of lenses in the transparent substrate, wherein each lens is a micro lens, and the lenses have a refraction ratio differing from that of the transparent substrate;
forming a color filter on the lenses;
flipping the working substrate over so as to engage the color filter with an image sensing device; and
planarizing the working substrate, whereby the remaining working substrate serves as a passive layer to protect the color filter, after the color filter is engaged with the image sensing device.

2. The method for fabricating the image sensor of claim 1, wherein the engagement of the color filter and the image sensing device comprises steps of:
forming a concave portion in a sensing area; and
contiguously disposing the color filter to a bottom of the concave portion.

3. The method for fabricating the image sensor of claim 1, wherein the engagement of the color filter and the image sensing device comprises steps of disposing the color filter contiguously to a backside of the image sensing device.

4. The method for fabricating the image sensor of claim 1, wherein the formation of the color filter comprises steps of forming a plurality of color filtering elements over and corresponding to the lenses.

5. The method for fabricating the image sensor of claim 1, wherein the formation of the color filter comprises steps of forming a planarization layer overlying the lenses, and forming a plurality of color filtering elements overlying the planarization layer.

6. The method for fabricating the image sensor of claim 1, wherein after the color filter is engaged with the image sensing device, further comprising:
removing the working substrate; and
forming a passive layer on the transparent substrate opposite to the lenses.

* * * * *